United States Patent
Fan

(10) Patent No.: US 10,580,510 B2
(45) Date of Patent: Mar. 3, 2020

(54) TEST SYSTEM AND METHOD OF OPERATING THE SAME

(71) Applicant: NANYA TECHNOLOGY CORPORATION, New Taipei (TW)

(72) Inventor: Kung-Ming Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 32 days.

(21) Appl. No.: 15/864,374

(22) Filed: Jan. 8, 2018

(65) Prior Publication Data

US 2019/0198128 A1    Jun. 27, 2019

Related U.S. Application Data

(60) Provisional application No. 62/609,661, filed on Dec. 22, 2017.

(51) Int. Cl.
| | |
|---|---|
| *G11C 11/4074* | (2006.01) |
| *G11C 29/02* | (2006.01) |
| *G11C 11/408* | (2006.01) |
| *G11C 11/4078* | (2006.01) |
| *G11C 29/04* | (2006.01) |
| *G11C 29/24* | (2006.01) |

(52) U.S. Cl.
CPC ........ *G11C 29/025* (2013.01); *G11C 11/4074* (2013.01); *G11C 11/4078* (2013.01); *G11C 11/4085* (2013.01); *G11C 29/04* (2013.01); *G11C 29/24* (2013.01)

(58) Field of Classification Search
CPC ........................... G11C 29/025; G11C 11/4074
USPC .................................................. 365/189.07
See application file for complete search history.

(56) References Cited

U.S. PATENT DOCUMENTS

| | | | |
|---|---|---|---|
| 7,061,820 B2 | 6/2006 | Deng | |
| 9,685,240 B1 | 6/2017 | Park | |
| 9,953,696 B2* | 4/2018 | Kim | ................. G11C 11/40622 |
| 2009/0161462 A1* | 6/2009 | Chung | ............... G11C 16/0416 |
| | | | 365/206 |

(Continued)

FOREIGN PATENT DOCUMENTS

| | | |
|---|---|---|
| CN | 107025927 A | 8/2017 |
| TW | 201432698 A | 8/2014 |

OTHER PUBLICATIONS

Taiwanese Intellectual Property Office, Office Action, dated Nov. 20, 2018, 5 pages, with English translation (6 pages).

*Primary Examiner* — Huan Hoang
*Assistant Examiner* — Muna A Techane
(74) *Attorney, Agent, or Firm* — Muncy, Geissler, Olds & Lowe, P.C.

(57) ABSTRACT

The present disclosure provides a test system, and a method of operating the same. The test system is for testing a DRAM (dynamic random access memory). The DRAM includes an array including a first memory row and a second memory row. The first memory row includes a first word line. The second memory row includes a second word line and a test cell. The second word line is immediately adjacent to the first word line. The test cell is controllable by the second word line. The test system includes a work station. The work station is configured to evaluate a row hammer effect on the second memory row based on a leakage charge, caused by an AC component of a pulse applied to the first word line, from the test cell.

9 Claims, 14 Drawing Sheets

(56) References Cited

U.S. PATENT DOCUMENTS

2010/0220511 A1* 9/2010 Kurjanowicz ......... G11C 17/16
              365/96
2014/0085995 A1* 3/2014 Greenfield ............... G11C 7/24
              365/201

* cited by examiner

TEST SYSTEM AND METHOD OF OPERATING THE SAME

PRIORITY CLAIM AND CROSS-REFERENCE

This application claims the benefit of provisional application Ser. 62/609,661 filed on Dec. 22, 2017, entitled "TEST SYSTEM AND METHOD OF OPERATING THE SAME" the disclosure of which is hereby incorporated by reference in its entirety.

TECHNICAL FIELD

The present disclosure relates to a test system and a method of operating the same, and more particularly, to a test system for testing a dynamic random access memory (DRAM).

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic HIGH and a logic LOW, two bit lines (BLs) are typically used for each bit, wherein the first bit line in the bit line pair is known as a bit line true (BLT) and the other bit line in the bit line pair is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a test system. The test system is for testing a DRAM (dynamic random access memory). The DRAM includes an array including a first memory row and a second memory row. The first memory row includes a first word line. The second memory row includes a second word line and a test cell. The second word line is immediately adjacent to the first word line. The test cell is controllable by the second word line. The test system includes a work station. The work station is configured to evaluate a row hammer effect on the second memory row based on a leakage charge, caused by an AC component of a pulse applied to the first word line, from the test cell.

In some embodiments, the work station is further configured to measure a leakage current caused by the AC component, and to calculate the leakage charge by multiplying the leakage current by one activation period of the first word line.

In some embodiments, the test system further comprises a power supply. The power supply is configured to provide the pulse having a high state and a low state, wherein the work station is further configured to establish a relationship between a threshold voltage level of the high state and a threshold leakage charge, caused by the AC component, from the test cell. The row hammer effect occurs in response to the threshold voltage level and the threshold leakage charge.

In some embodiments, the first memory row includes a cell including a transistor. The test system further comprises a power supply. The power supply is configured to provide a first voltage and a second voltage to a drain and a source, respectively, of the transistor, wherein the work station is configured to establish a relationship among the first voltage, the second voltage, and a threshold leakage charge, caused by the AC component, from the test cell. The row hammer effect occurs in response to the first voltage, the second voltage and the threshold leakage charge.

In some embodiments, the power supply is further configured to provide a third voltage to a body of the transistor, wherein the work station is configured to establish a relationship among the first voltage, the second voltage, the third voltage and the threshold leakage charge. The row hammer effect occurs in response to the first voltage, the second voltage, the third voltage and the threshold leakage charge.

In some embodiments, the first memory row includes a cell including a transistor. The test system further comprises a power supply. The power supply is configured to provide a second voltage to a body of the transistor, wherein the work station is configured to establish a relationship between the second voltage and a threshold leakage charge, caused by the AC component, from the test cell. The row hammer effect occurs in response to the second voltage and the threshold leakage charge.

In some embodiments, the work station is further configured to calculate the leakage charge by eliminating a first charge caused by a DC component of the pulse from a second charge caused by the pulse.

In some embodiments, a DC current and the pulse are applied to the first word line in a staggered manner. The work station is configured to measure a first leakage current, caused by the DC current, from the test cell; measure a second leakage current, caused by the pulse, from the test cell; and evaluate the row hammer effect based on the first leakage current and the second leakage current.

In some embodiments, the work station is further configured to calculate the first charge by multiplying the first leakage current by one activation period of the first word line, and to calculate the second charge by multiplying the second leakage current by the one activation period.

In some embodiments, the work station is further configured to calculate the leakage charge by cancelling the first charge and the second charge.

Another aspect of the present disclosure provides a method. The method comprises applying a pulse to a first word line of a memory array; and evaluating a row hammer effect on a second word line of the memory array based on a leakage charge, caused by an AC component of the pulse, from a test cell. The second word line is immediately adjacent to the first word line. The test cell is controllable by the second word line.

In some embodiments, the method further comprises measuring a leakage current caused by the AC component; and calculating the leakage charge by multiplying the leakage current by one activation period of the first word line.

In some embodiments, the pulse has a high state and a low state. The method further comprises establishing a relationship between a threshold voltage level of the high state and a threshold leakage charge, caused by the AC component, from the test cell. The row hammer effect occurs in response to the threshold voltage level and the threshold leakage charge.

In some embodiments, the method further comprises providing a first voltage and a second voltage to a drain and a source, respectively, of a transistor controllable by the first word line; and establishing a relationship among the first voltage, the second voltage, and a threshold leakage charge, caused by the AC component, from the test cell. The row hammer effect occurs in response to the first voltage, the second voltage and the threshold leakage charge.

In some embodiments, the method further comprises providing a third voltage to a body of the transistor; and establishing a relationship among the first voltage, the second voltage, the third voltage and the threshold leakage charge. The row hammer effect occurs in response to the first voltage, the second voltage, the third voltage and the threshold leakage charge.

In some embodiments, the method further comprises providing a second voltage to a body of the transistor; and establishing a relationship between the second voltage and a threshold leakage charge, caused by the AC component, from the test cell, wherein a row hammer effect occurs in response to the second voltage and the threshold leakage charge.

In some embodiments, the method further comprises calculating the leakage charge by eliminating a first charge caused by a DC component of the pulse from a second charge caused by the pulse.

In some embodiments, the method further comprises applying a DC current to the first word line; measuring a first leakage current, caused by the DC current, from the test cell; measuring a second leakage current, caused by the pulse, from the test cell; and evaluating the row hammer effect based on the first leakage current and the second leakage current.

In some embodiments, the method further comprises: calculating the first charge by multiplying the first leakage current by one activation period of the first word line; and calculating the second charge by multiplying the second leakage current by the one activation period.

In some embodiments, the method further comprises: calculating the leakage charge by cancelling the first charge and the second charge.

In the present disclosure, the work station is able to establish a relationship between a threshold leakage charge and at least one of the first voltage, the second voltage, the third voltage, and a voltage level of a HIGH state of the AC pulse, and further able to create a model for EDA tools based on the relationship, which facilitates a design of a DRAM.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description.

DETAILED DESCRIPTION

Figure 1:
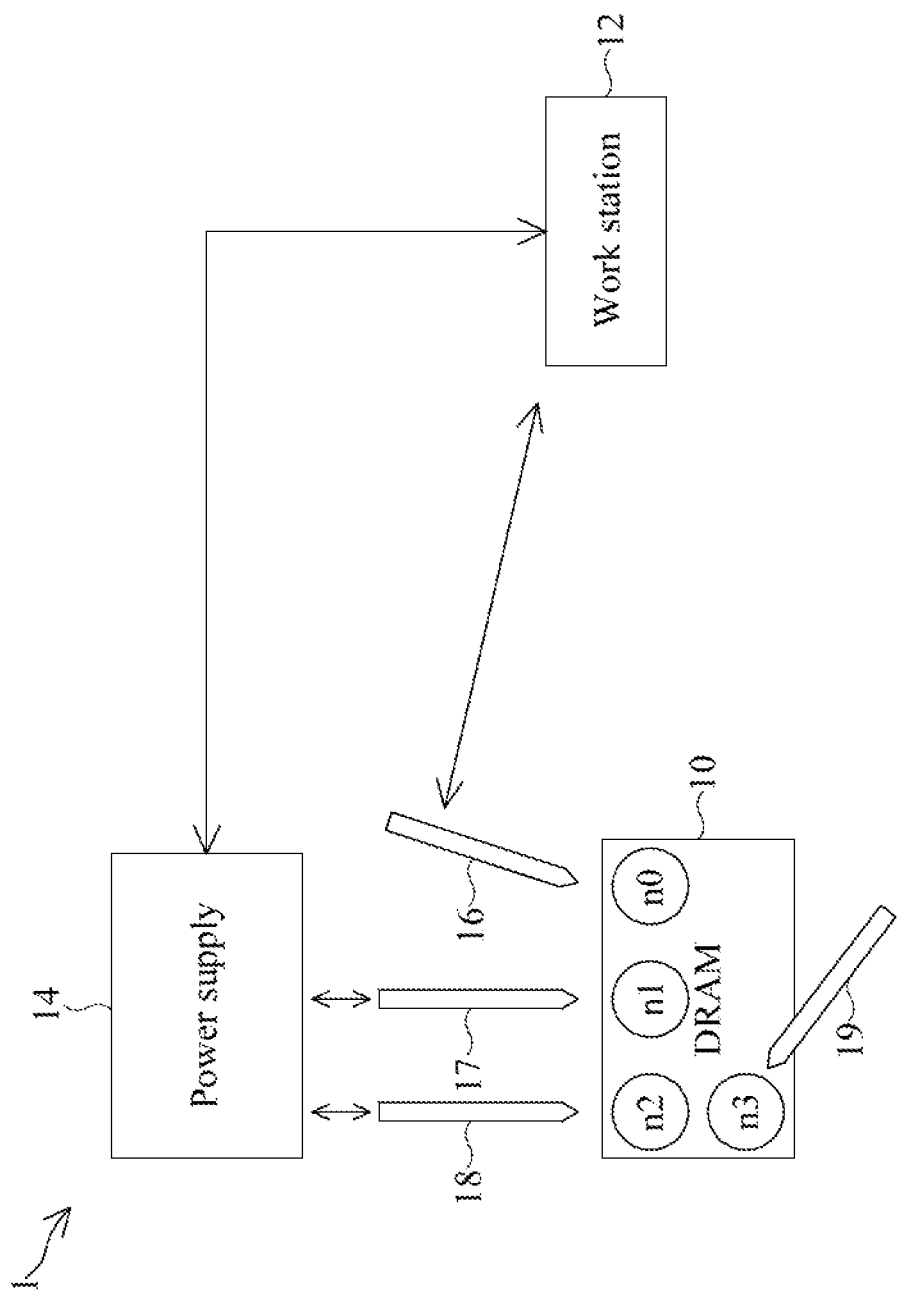
FIG. 1 is a schematic diagram of a test system for testing a dynamic random access memory (DRAM), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a test system 1 for testing a dynamic random access memory (DRAM) 10, in accordance with some embodiments of the present disclosure. Referring to FIG. 1, the test system 1 includes a work station 12 and a power supply 14.

The work station 12 functions to measure a leakage current of the DRAM 10, thereby evaluating a row hammer effect as will be described in detail with reference to FIGS. 3 to 5. In further detail, the work station 12 functions to measure the leakage current by using a probe 16 to sense an electrical signal from a pin n0 of the DRAM 10.

The power supply 14 functions to provide a pulse to a pin n1 of the DRAM 10 via a probe 17, thereby emulating a row hammer effect as will be described in detail below. A voltage level of a HIGH state of the pulse is a factor which affects a row hammer effect of the DRAM 10, as will be described in detail below. Accordingly, it is possible to analyze the row hammer effect under different voltage levels of the pulse, which facilitates a design of the DRAM 10. Also, a voltage level of a LOW state of the pulse is another factor which affects a row hammer effect of the DRAM 10. Similarly, the power supply 14 functions to provide a first voltage and a second voltage to pins n2 and n3 of the DRAM 10 via probes 18 and 19, respectively. Accordingly, it is possible to analyze the row hammer effect under different voltage levels of each of the first voltage and the second voltage, which facilitates a design of the DRAM 10.

An operator is able to calculate a leakage charge associated with a row hammer effect by measuring the leakage current. Hence, a circuit designer is able to create a model for an electronic design automation (EDA) tool based on a relationship between the leakage charge calculated and a row hammer effect, which facilitates a design of a DRAM.

Figure 2:
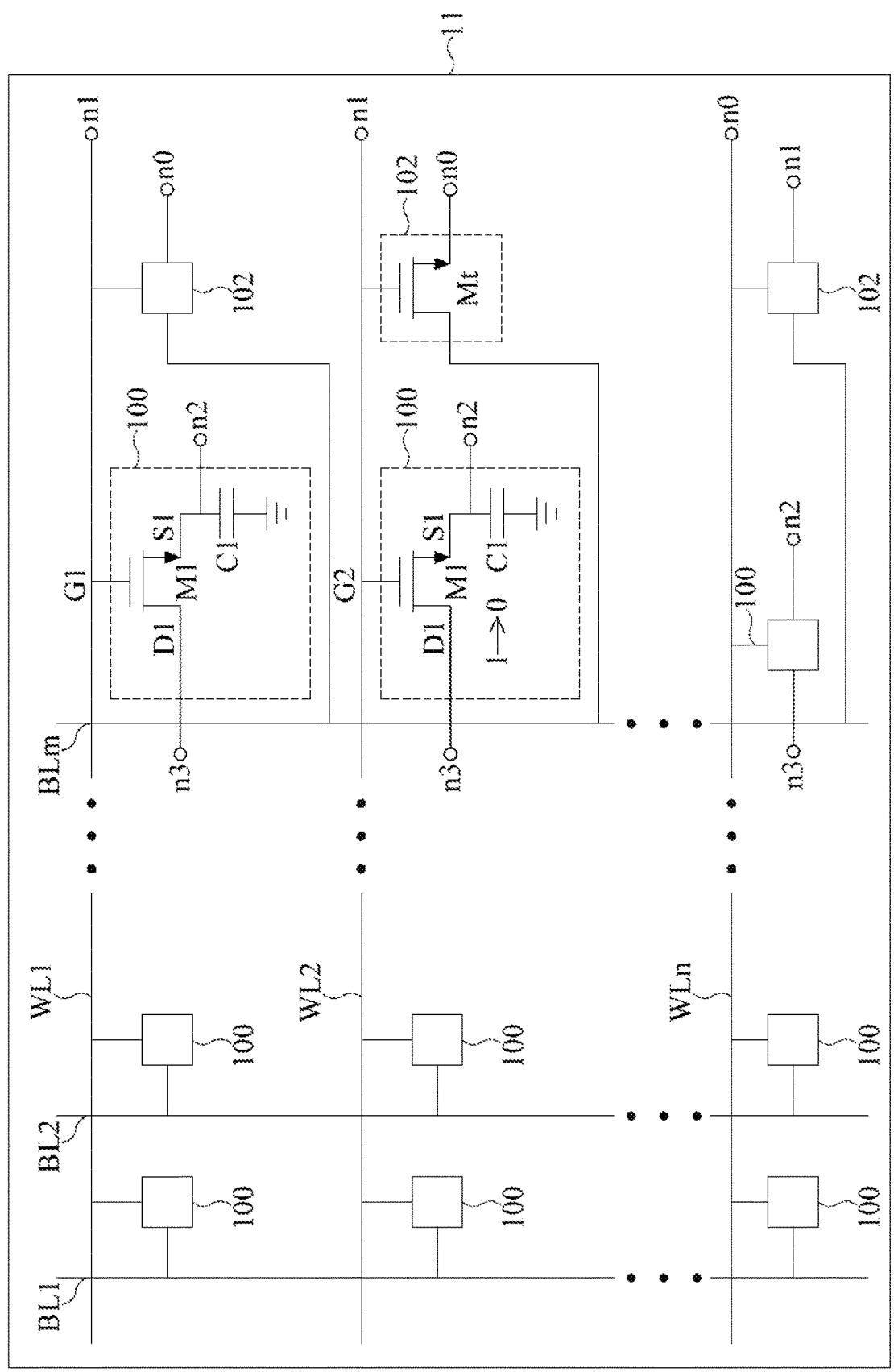
FIG. 2 is a schematic diagram of the DRAM shown in FIG. 1, in accordance with some embodiments of the present disclosure.

FIG. 2 is a schematic diagram of the DRAM 10 shown in FIG. 1, in accordance with some embodiments of the present disclosure. Referring to FIG. 2, the DRAM 10 includes a memory array 11.

The memory array 11 includes a plurality of memory cells 100 arranged in a two-dimensional array. The memory cell 100 functions to store data. In addition to the memory cells 100, the memory array 11 further includes a plurality of word lines WL1 to WLn and a plurality of bit lines BL1 to BLm, wherein n and m are positive integers. The word lines WL1 to WLn and the bit lines BL1 to BLm are used to control operation of the associated memory cells 100. The memory cells 100 in the same row and a word line for accessing the memory cells 100 in the same row can together be deemed as a memory row.

Moreover, the memory array 11 further includes a plurality of test cells 102. The test cell 102 serves as a pseudo memory cell. In further detail, the test cell 102 typically has the same components and structures as the memory cell 100 except that the test cell 102 is free of a component for storing charge representing content of data.

It is possible to evaluate a row hammer effect on a particular memory row based on a leakage current from the test cell 102 in the particular memory row. In the present embodiment, each of the memory rows of the DRAM 10 is equipped with one test cell 102. However, the present disclosure is not limited thereto. In some embodiments, only the particular memory row is equipped with the test cell 102.

The memory cell 100 includes a transistor M1 and a capacitor C1. The transistor M1 serves as a switch, and is controlled by the associated word line. The capacitor C1 functions to store a charge representing data.

In the present embodiment, a memory row (hereinafter, a second memory row) associated with the word line WL2 is subject to a row hammer effect when a memory row (hereinafter, a first memory row) associated with the word line WL1 is accessed a threshold number of times within a self-refresh cycle. In further detail, when the first memory row has been accessed more than, for example, about 300,000 times in a given period such as within a self-refresh cycle, the second memory row is subject to a row hammer effect, i.e. a row hammer effect may occur. To facilitate a better understanding of the row hammer effect, assume that a capacitor (hereinafter, a second capacitor) associated with the word line WL2 has a logic HIGH. The word line WL2 is immediately adjacent to the word line WL1. If the word line WL1 is accessed more than, for example, about 300,000 times in a given period, data stored by the second capacitor may be flipped from a logic HIGH to a logic LOW. Such scenario is called a row hammer effect. Since such flip is not intended, such flip may lead to the DRAM 10 working abnormally, or providing the wrong data.

The test cell 102 includes a transistor Mt. Taking the test cell 102, which is controllable by the word line WL2, for instance, a gate of the transistor Mt is coupled to the word line WL2, a drain of the transistor Mt is coupled to the bit line BLm, and a source of the transistor Mt is coupled to the pin n0 to be sensed by the probe 16. In the present embodiment, the drain of the transistor Mt is coupled to the bit line BLm. However, the present disclosure is not limited thereto. In some embodiments, the drain of the transistor Mt is coupled to another bit line. In some embodiments, the transistor Mt has the same aspect ratio as the transistor M1, thereby accurately emulating an operation of the transistor M1. Therefore, the test cell 102 is referred to as a pseudo memory cell. However, the present disclosure is not limited thereto. In some embodiments, the transistor Mt has the different aspect ratio from the transistor M1.

Figure 3:
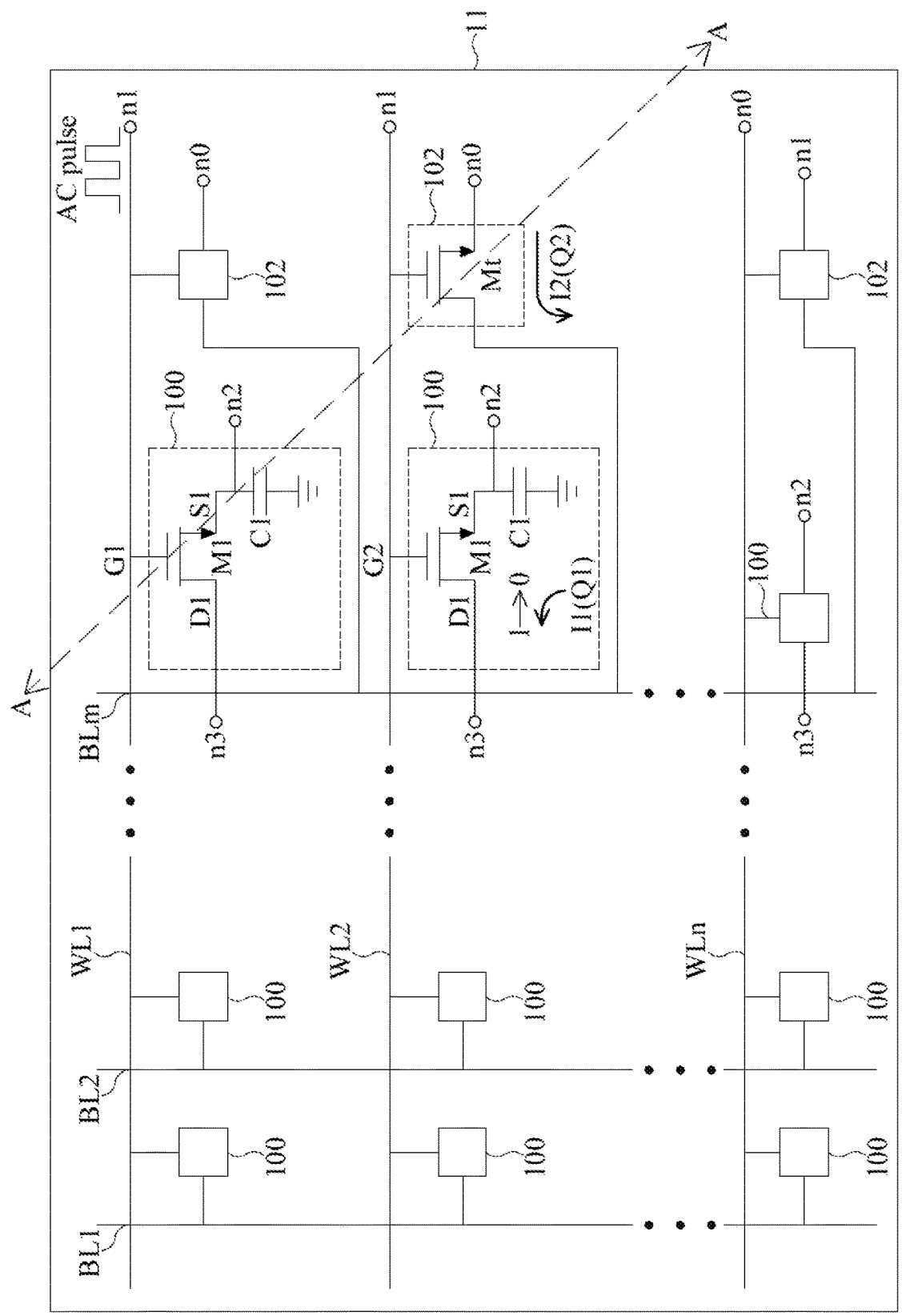
FIG. 3 is a schematic diagram illustrating a test of the DRAM shown in FIG. 1, in accordance with some embodiments of the present disclosure.

FIG. 3 is a schematic diagram illustrating a test of the DRAM 10 shown in FIG. 1, in accordance with some embodiments of the present disclosure. Referring to FIG. 3, to facilitate the understanding of the test, the word lines WL1 and WL2 are taken for instance. To emulate an access operation of the word line WL1, an alternating current (AC) pulse is provided from the power supply 14 via the probe 17, and is applied to the pin n1 associated with the word line WL1. The AC pulse is free from a direct current (DC) component. In response to a HIGH state of the AC pulse, a leakage current I1 from the transistor M1 associated with the word line WL2 is induced. When a leakage charge Q1 associated with the leakage current I1 reaches a threshold quantity, a data stored in the capacitor C1 associated with the word line WL2 is flipped, i.e., a row hammer effect occurs.

A leakage current I2 from the transistor M2 is also induced in response to a HIGH state of the AC pulse. Typically, magnitude of the leakage current I2 is the same as that of the leakage current I1. Hence, quantity of a leakage charge Q2 associated with the leakage current I2 is the same as a quantity of the leakage charge Q1 associated with the leakage current I1. As previously mentioned, the work station 12 functions to measure the magnitude of the leakage current I2 via the probe 16 and the pin n0. Consequently, the work station 12 is able to evaluate a row hammer effect on the second memory row based on the leakage charge Q2, caused by the AC pulse.

In further detail, the work station 12 functions to measure the leakage current I2 caused by the AC component, and to calculate the leakage charge Q2 by multiplying the leakage current I2 by one activation period of the word line WL1.

The work station 12 may continually monitor whether a data of the capacitor C1 associated with the word line WL2 is flipped. When the data is flipped, the work station 12 records the current leakage charge Q2 as a threshold leakage charge. The work station 12 may create a model for EDA tools based on a relationship between the leakage charge and a row hammer effect, which facilitates a design of a DRAM. For example, a circuit designer may perform a simulation by running the model using the EDA tools. When the simulation result reflects that the leakage charge Q2 reaches the threshold leakage charge, the circuit designer can realize that a row hammer effect occurs and can therefore adjust a design of the DRAM 10.

Figure 4:
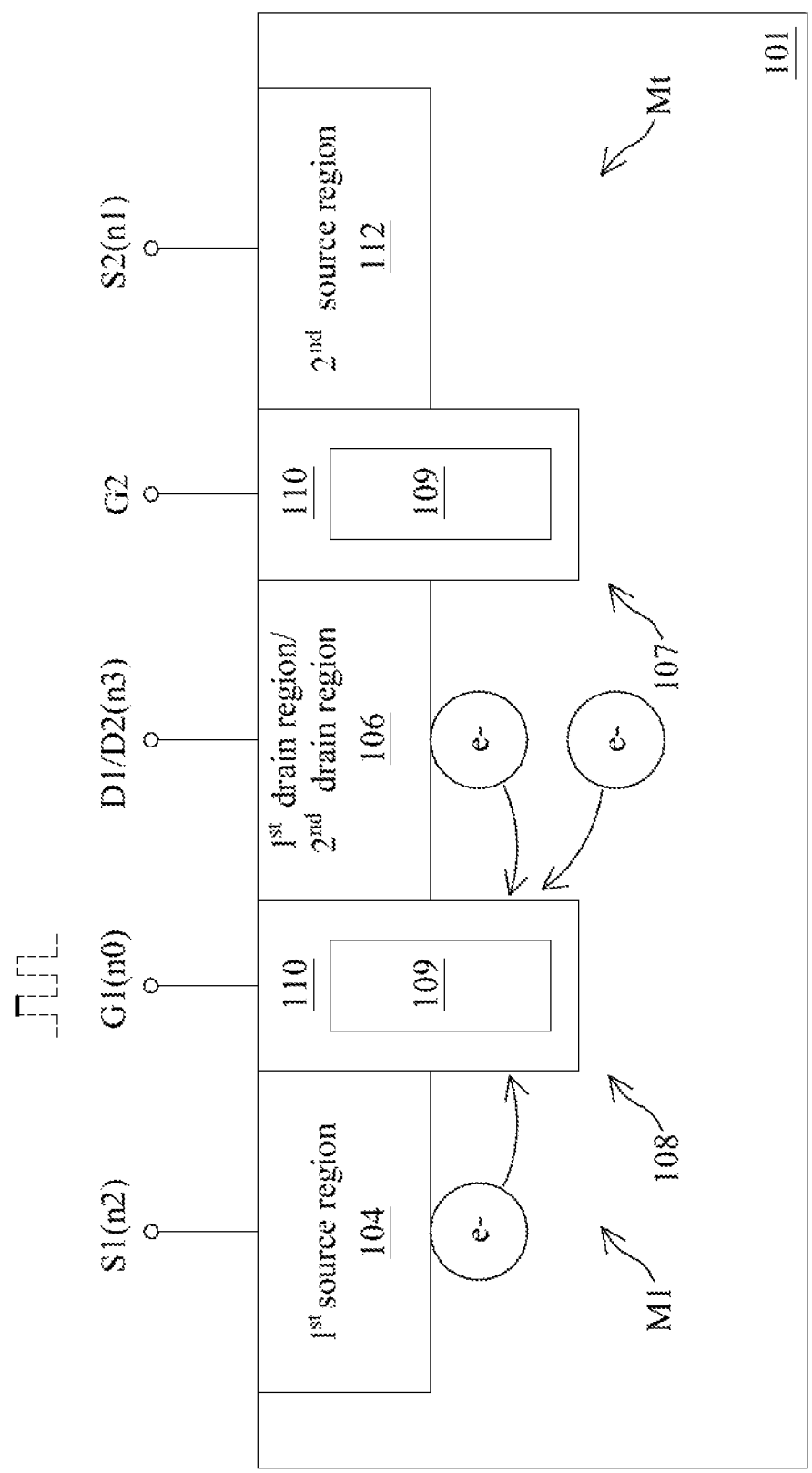
FIG. 4 is a cross-sectional view of the DRAM shown in FIG. 3 taken along a line A-A for illustrating a row hammer effect, in accordance with some embodiments of the present disclosure.
Figure 5:
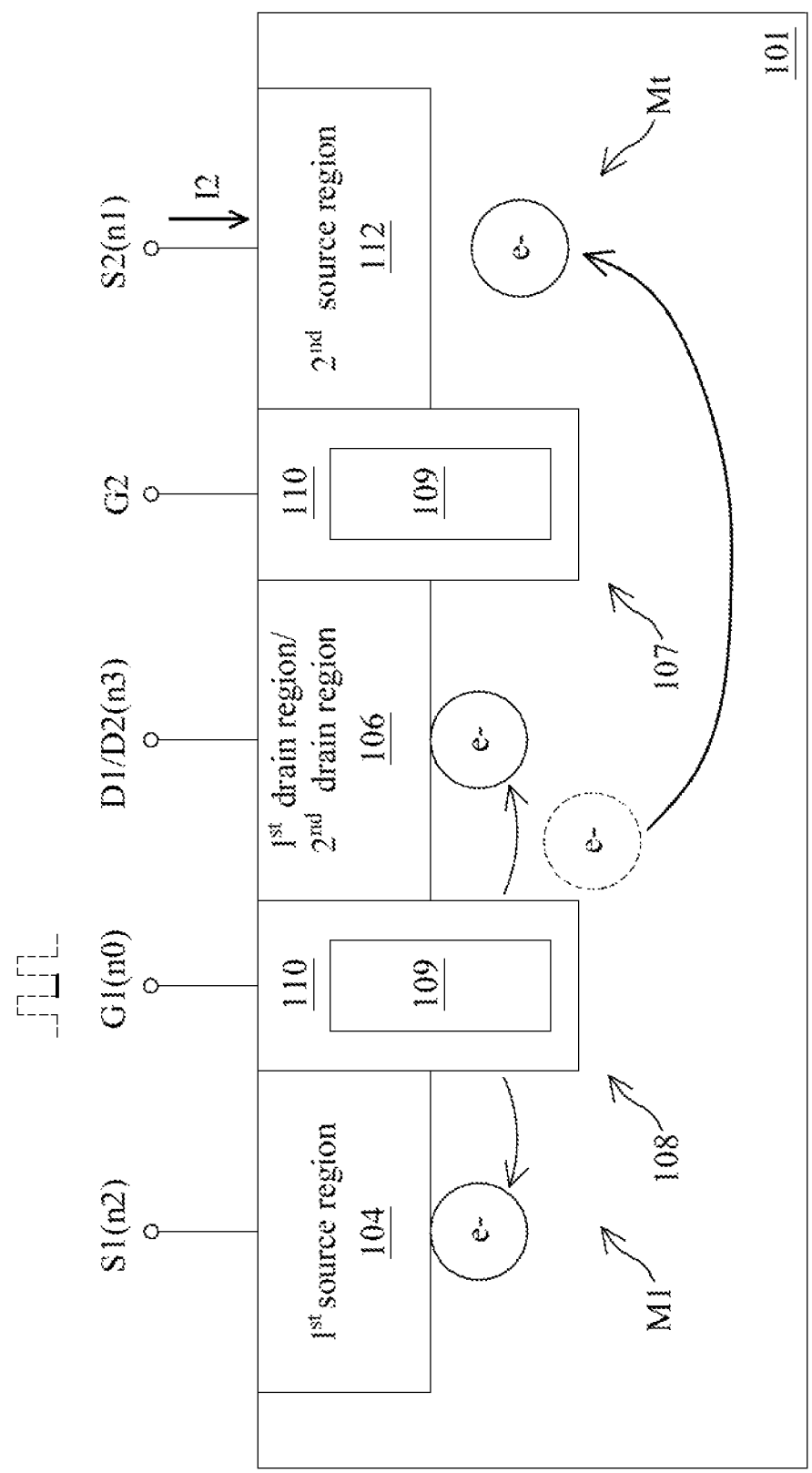
FIG. 5 is a cross-sectional view of the DRAM shown in FIG. 3 for illustrating a row hammer effect, in accordance with some embodiments of the present disclosure.

To better understand why a row hammer effect occurs, an interaction between semiconductor components is introduced in FIGS. 4 and 5.

FIG. 4 is a cross-sectional view of the DRAM 10 shown in FIG. 3 taken along a line A-A for illustrating a row hammer effect, in accordance with some embodiments of the present disclosure. Referring to FIG. 4, the transistor M1 includes a first source region 104 in a substrate 101, a gate structure 108 defined by a conductive material 109 and a dielectric material 110, and a first drain region 106. The transistor Mt includes a second source region 112, a gate structure 107 also defined by the conductive material 109 and the dielectric material 110, and a second drain region 106. The transistor Mt and the transistor M1 share the same doped region, and the doped region serves as the first drain region 106 of the transistor M1 and the second drain region 106 of the transistor Mt.

In operation, when the transistor M1 is conducted in response to a HIGH state of the AC pulse, electrons stored in the first source region 104 and the first drain region 106 move to the gate structure 108 of the transistor M1, and are trapped at an interface between a bottom of the gate structure 108 and the substrate 101.

FIG. 5 is a cross-sectional view of the DRAM 10 shown in FIG. 3 for illustrating a row hammer effect, in accordance with some embodiments of the present disclosure. Referring to FIG. 5, after the operation shown in FIG. 4, when the transistor M1 is not conducted in response to a LOW state of the AC pulse, some electrons move to the first source region 104 and the first drain region 106 in which the electrons were originally stored. However, some trapped electrons may be re-emitted to the second source region 112, resulting in the leakage current I2. For similar reasons, some trapped electrons may be re-emitted to the transistor M1 associated with the word line WL2, resulting in the leakage current I1 and decrease of potential of the capacitor C1 associated with the word line WL2.

In view of the movement and re-emitting action mentioned above, a voltage level of a HIGH state of the AC pulse may also affect a magnitude of the leakage current I2 (and may affect a magnitude of the leakage current I1 as well). In further detail, an operator is able to set a predetermined voltage level of the HIGH state, calculate the leakage charge, and observe whether a row hammer effect occurs. By repeating such procedure, the operator can find a threshold voltage level of the HIGH state and a threshold leakage charge at which the row hammer effect occurs. Hence, the work station 12 establishes a relationship between the threshold voltage level of the HIGH state and the threshold leakage charge, and creates a model for EDA tools based on the relationship, which facilitates a design of a DRAM. Similarly, by using the same approaches, the work station 12 can also create a model for EDA tools based on a relationship between a threshold voltage level of a LOW state of the AC pulse and a threshold leakage charge.

Similarly, a voltage level of the first voltage applied to a source of the transistor M1 associated with the word line WL1 may also affect a magnitude of the leakage current I2 (and may affect a magnitude of the leakage current I1 as well). An operator is able to set a predetermined voltage level of the first voltage, calculate the leakage charge, and observe whether a row hammer effect occurs. By repeating such procedure, the operator can find a threshold voltage level of the first voltage and a threshold leakage charge at which the row hammer effect occurs. Hence, the work station 12 establishes a relationship between the threshold voltage level of the first voltage and the threshold leakage charge, and creates a model for EDA tools based on the relationship, which facilitates a design of a DRAM.

Similarly, a voltage level of a second voltage applied to a drain of the transistor M1 associated with the word line WL1 may also affect a magnitude of the leakage current I2 (and may affect a magnitude of the leakage current I1 as well). An operator is able to set a predetermined voltage level of the second voltage, calculate the leakage charge, and observe whether a row hammer effect occurs. By repeating such procedure, the operator can find a threshold voltage level of the second voltage and a threshold leakage charge at which the row hammer effect occurs. Hence, the work station 12 establishes a relationship between the threshold voltage level of the second voltage and the threshold leakage charge, and creates a model for EDA tools based on the relationship, which facilitates a design of a DRAM.

Similarly, a voltage level of a third voltage provided from the power supply 12 and applied to a body of the transistor M1 may also affect a magnitude of the leakage current I2 (and may affect a magnitude of the leakage current I1 as well). An operator is able to set a predetermined voltage level of the third voltage, calculate the leakage charge, and observe whether a row hammer effect occurs. By repeating such procedure, the operator can find a threshold voltage level of the third voltage and a threshold leakage charge at which the row hammer effect occurs. Hence, the work station 12 establishes a relationship between the threshold voltage level of the third voltage and the threshold leakage charge, and creates a model for EDA tools based on the relationship, which facilitates a design of a DRAM.

In some embodiments, the work station 12 is able to establish a relationship between a threshold leakage charge and at least one of the first voltage, the second voltage, the third voltage, a voltage level of a HIGH state of the AC pulse and a voltage level of a LOW state of the AC pulse.

Consequently, the work station 12 is able to create a model for EDA tools based on the relationship, which facilitates a design of a DRAM.

Figure 6:
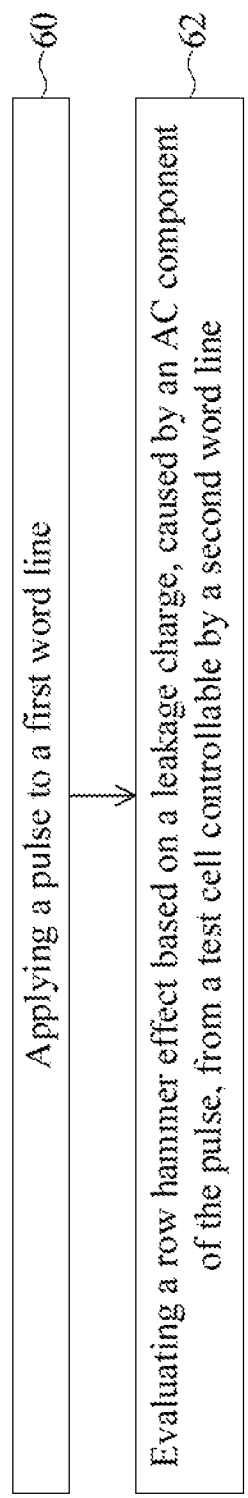
FIG. 6 is a flow chart of a method, in accordance with some embodiments of the present disclosure.

FIG. 6 is a flow chart of a method 6, in accordance with some embodiments of the present disclosure. Referring to FIG. 6, the method 6 includes operations 60 and 62.

The method 6 begins with operation 60, in which a pulse is applied to a first word line analogous to the word line WL1.

The method 6 proceeds to operation 62, in which a row hammer effect is evaluated based on a leakage charge analogous to the leakage charge Q2, caused by an AC component of the pulse, from a test cell analogous to the test cell 102 controllable by a second word line analogous to the word line WL2.

In the present disclosure, the method 6 facilitates a design of a DRAM.

The method 6 is merely an example, and is not intended to limit the present disclosure beyond what is explicitly recited in the claims Additional operations can be provided before, during, and after the method 6, and some operations described can be replaced, eliminated, or moved around for additional embodiments of the method.

Figure 7:
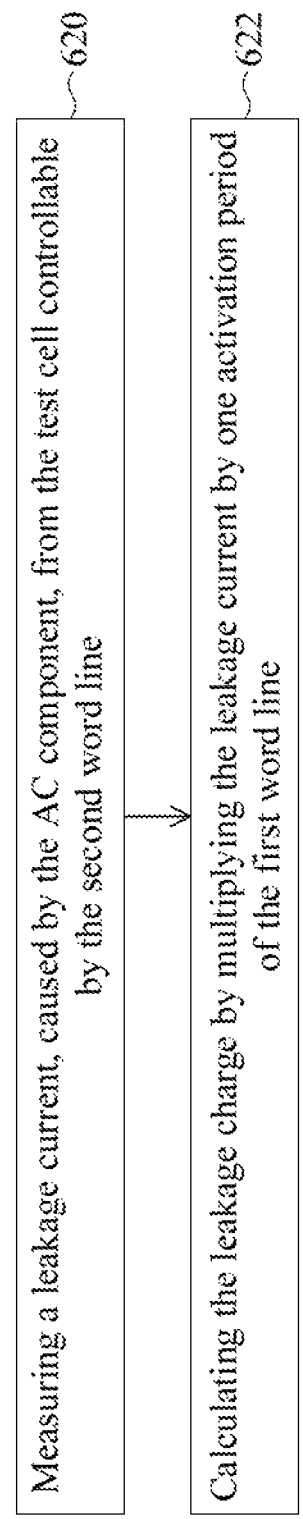
FIG. 7 is a flow chart of operation 62 shown in FIG. 6, in accordance with some embodiments of the present disclosure.

FIG. 7 is a flow chart of operation 62 shown in FIG. 6, in accordance with some embodiments of the present disclosure. Referring to FIG. 7, operation 62 includes operations 620 and 622.

Operation 62 begins with operation 620, in which a leakage current analogous to the leakage current I2, caused by the AC component, from the test cell controllable by the second word line is measured.

Operation 62 proceeds to operation 622, in which the leakage charge is calculated by multiplying the leakage current by one activation period of the first word line.

Operation 62 is merely an example, and is not intended to limit the present disclosure beyond what is explicitly recited in the claims Additional operations can be provided before, during, and after the operation 62, and some operations described can be replaced, eliminated, or moved around for additional embodiments of the method.

Figure 8:
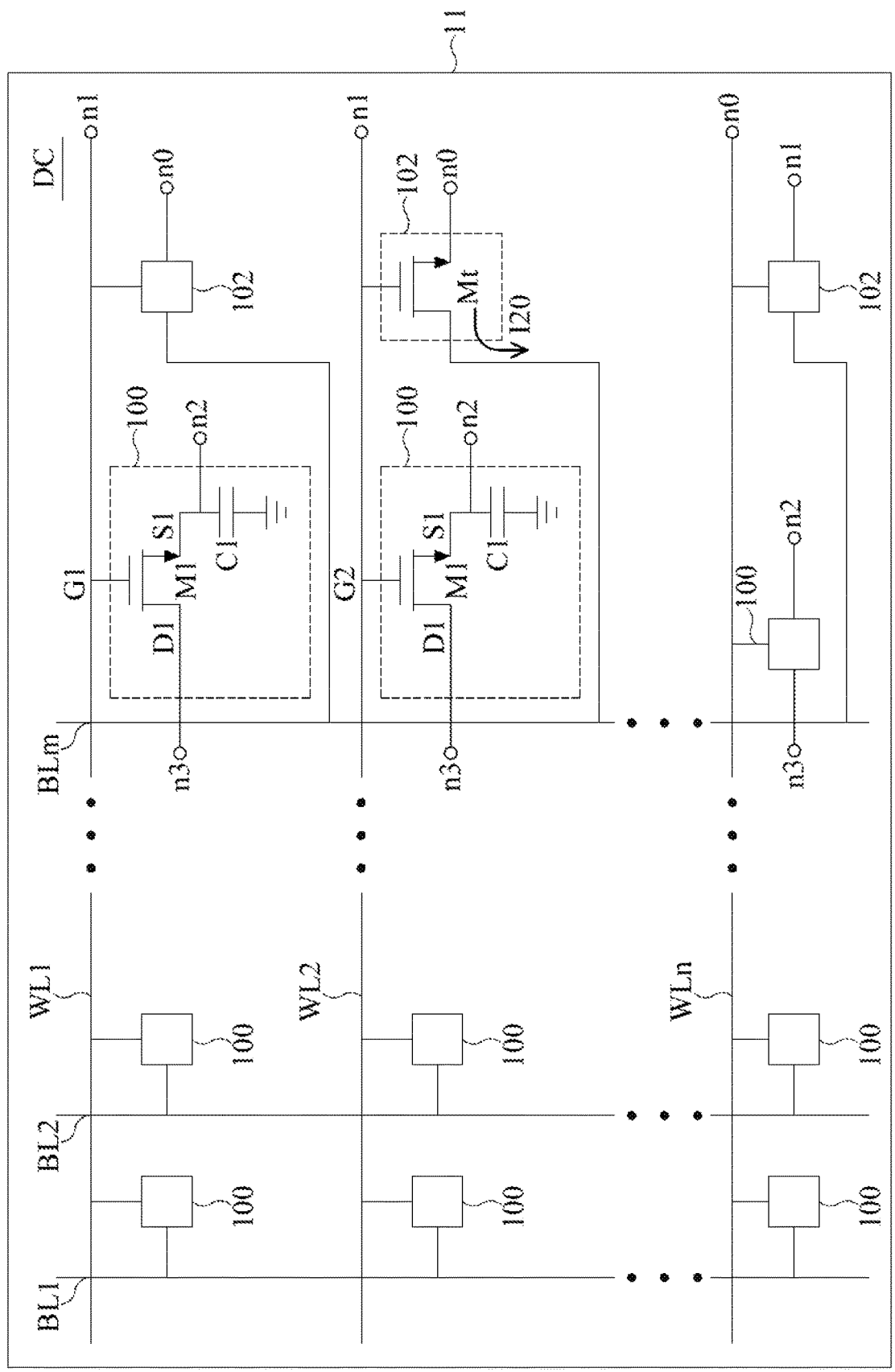
FIG. 8 is a schematic diagram illustrating an operation of another test of the DRAM shown in FIG. 1, in accordance with some embodiments of the present disclosure.

FIG. 8 is a schematic diagram illustrating an operation of another test of the DRAM 10 shown in FIG. 1, in accordance with some embodiments of the present disclosure. For the test discussed in the embodiment of FIG. 3, a pure AC pulse is required (i.e., the AC pulse does not includes any DC component). However, in some circumstances, the power supply 12 may not be able to provide the pure AC pulse. In this case, the test discussed in the embodiments shown in FIGS. 8 to 10 can be applied.

Referring to FIG. 8, a DC current is applied to the word line WL1. A first leakage current I20, caused by the DC current, from the test cell 120 is measured by the work station 12.

Figure 9:
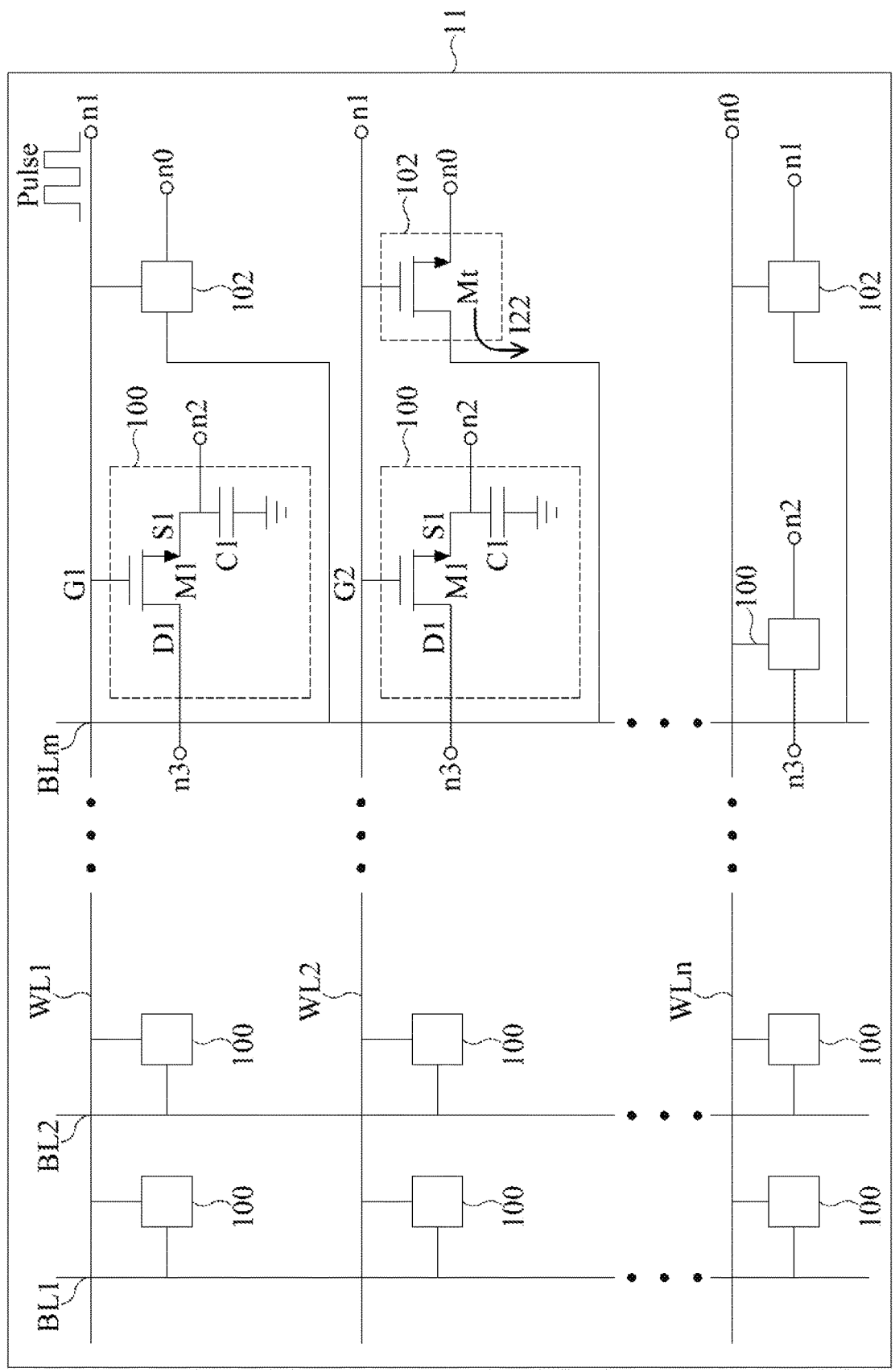
FIG. 9 is a schematic diagram illustrating another operation of the other test of the DRAM shown in FIG. 1, in accordance with some embodiments of the present disclosure.

FIG. 9 is a schematic diagram illustrating another operation of the other test of the DRAM 10 shown in FIG. 1, in accordance with some embodiments of the present disclosure. Referring to FIG. 9, a pulse including an AC component and a DC component is applied to the word line WL1. A second leakage current I22, caused by the pulse, from the test cell 120 is measured by the work station 12.

The work station 12 functions to evaluate a row hammer effect on the word line WL2 based on the first leakage current I20 and the second leakage current I22, as will be described in detail with reference to FIG. 10.

In the present embodiment, the operations shown in FIGS. 8 and 9 are interchangeable in order. Moreover, the DC current and the pulse are applied to the word line WL1 in a staggered manner.

Figure 10:
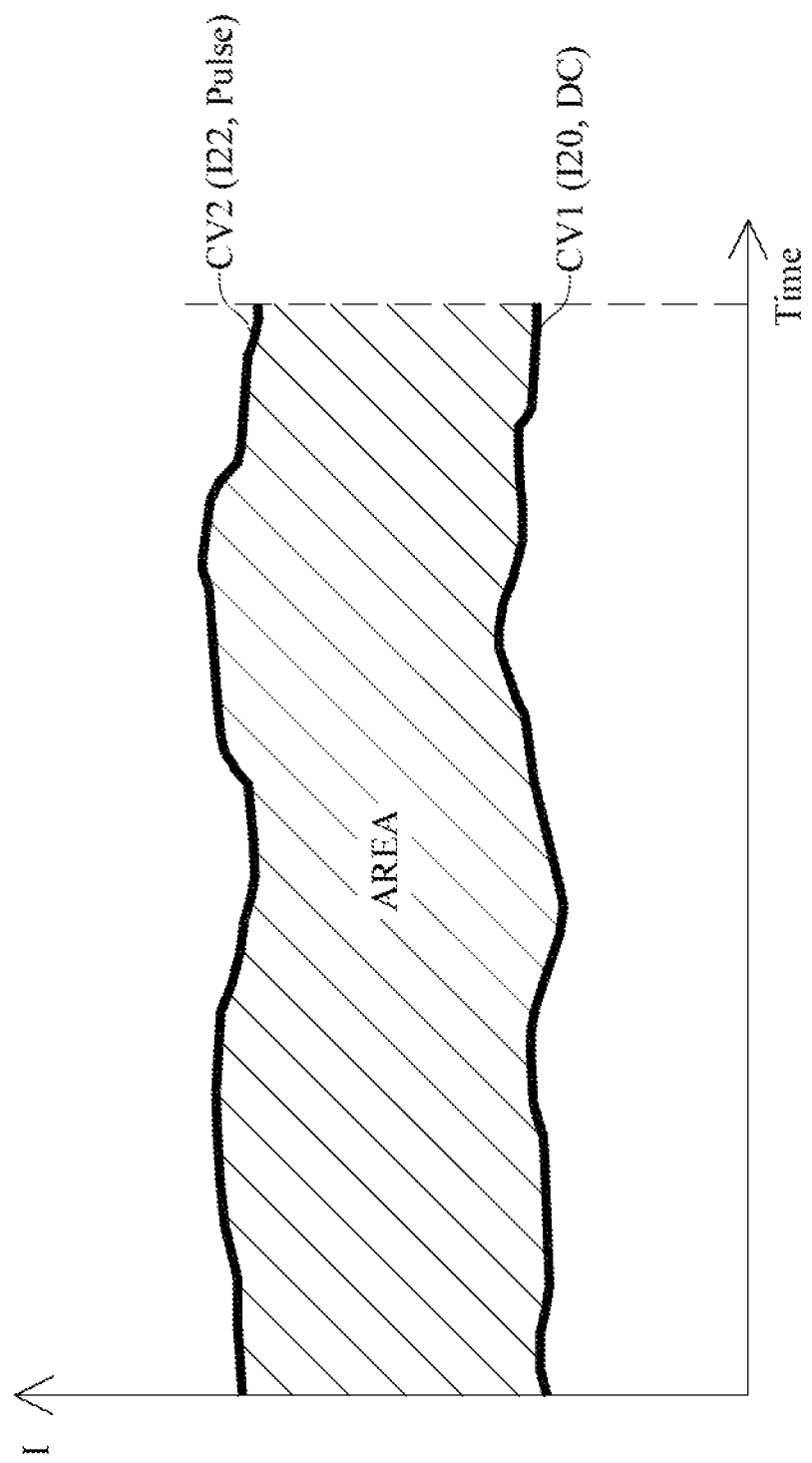
FIG. 10 is a waveform diagram illustrating a leakage charge of the DRAM tested with approaches shown in FIGS. 8 and 9, in accordance with some embodiments of the present disclosure.

FIG. 10 is a waveform diagram illustrating a leakage charge of the DRAM 10 tested with approaches shown in FIGS. 8 and 9, in accordance with some embodiments of the present disclosure. Referring to FIG. 10, a horizontal axis represents time, a dashed vertical line indicates one activation period of the word line WL1, and a vertical axis represents current.

A curve CV1 represents the first leakage current I20 caused by the DC current in one activation period of the word line WL1. An area under the curve CV1 represents the first charge caused by the DC current. The work station 12 functions to calculate the first charge by multiplying the first leakage current I20 by one activation period of the word line WL1.

A curve CV2 represents the second leakage current I22 caused by the pulse in one activation period of the word line WL1. An area under the curve CV2 represents the second charge caused by the pulse. The work station 12 functions to calculate the second charge by multiplying the second leakage current I22 by one activation period of the word line WL1.

An area between the curves CV1 and CV2 represents the leakage charge caused by the AC component of the pulse. The work station 12 functions to calculate the leakage charge by cancelling the first charge and the second charge, which means that the work station 12 is further configured to calculate the leakage charge by eliminating the first charge caused by the DC component of the pulse from the second charge caused by the pulse.

By adopting the test shown in FIGS. 8 to 10, a row hammer effect can still be evaluated even though the power supply 14 is unable to provide a pure AC pulse.

Figure 11:
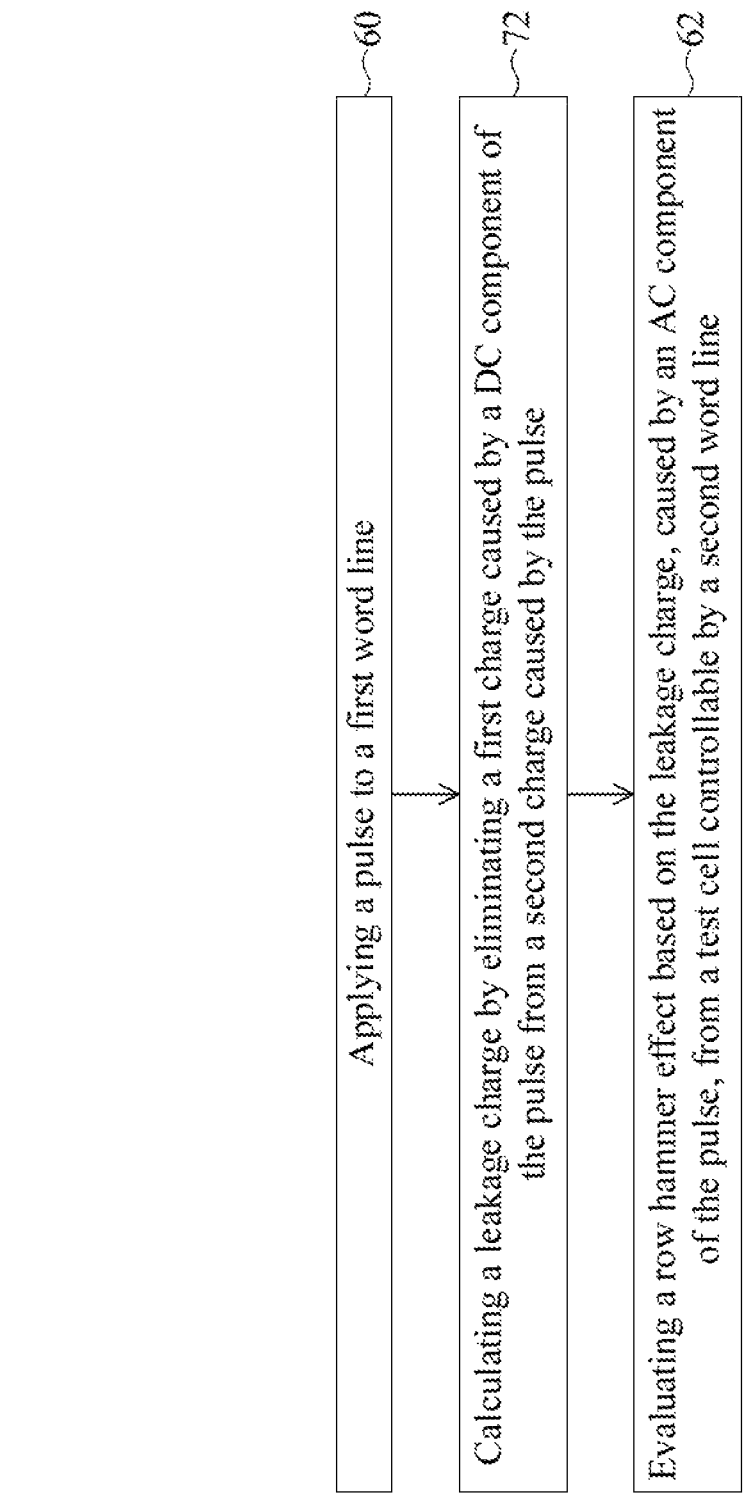
FIG. 11 is a flow chart of another method, in accordance with some embodiments of the present disclosure.

FIG. 11 is a flow chart of another method 7, in accordance with some embodiments of the present disclosure. Referring to FIG. 7, the method 7 is similar to the method 6 described and illustrated with reference to FIG. 6 except that, for example, the method 7 includes operation 72. In operation 72, a leakage charge is calculated by eliminating a first charge caused by a DC component of the pulse from a second charge caused by the pulse.

The method 7 is merely an example, and is not intended to limit the present disclosure beyond what is explicitly recited in the claims Additional operations can be provided before, during, and after the method 7, and some operations described can be replaced, eliminated, or moved around for additional embodiments of the method.

Figure 12:
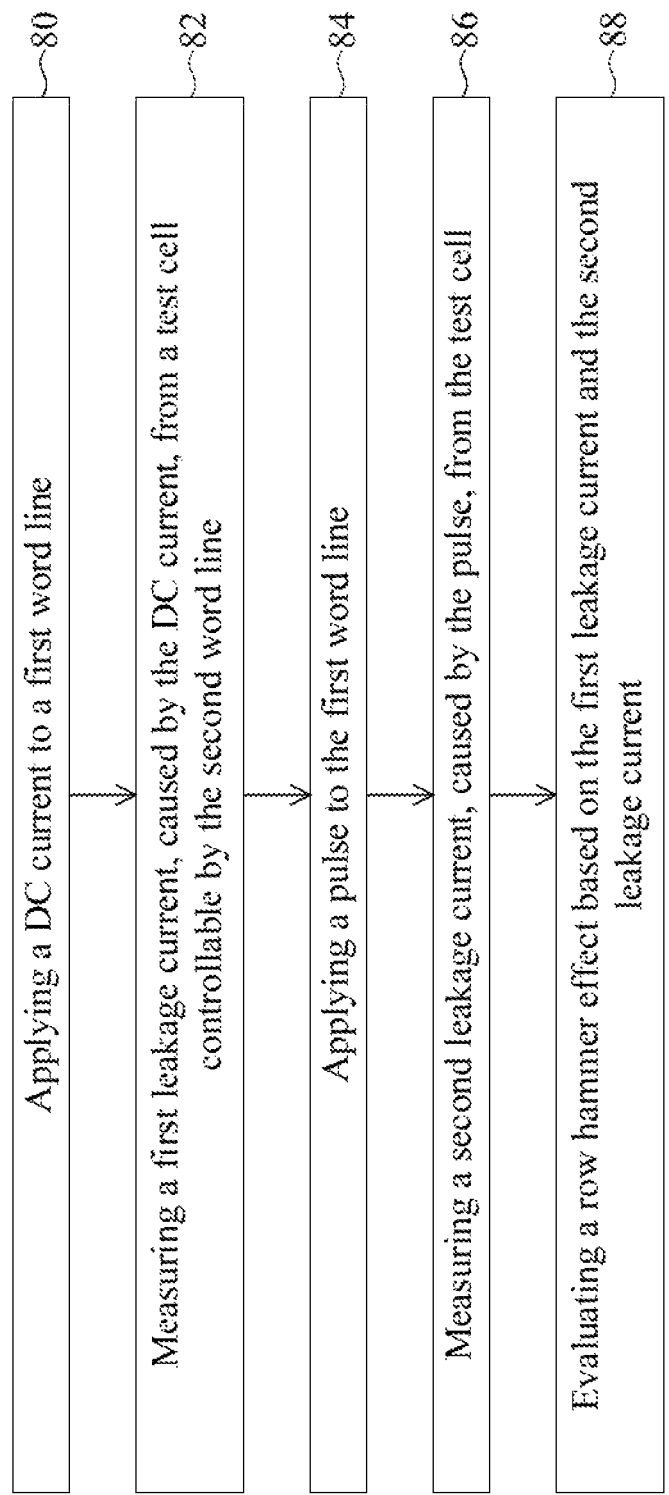
FIG. 12 is a flow chart of yet another method, in accordance with some embodiments of the present disclosure.

FIG. 12 is a flow chart of yet another method 8, in accordance with some embodiments of the present disclosure. Referring to FIG. 12, the method 8 includes operations 80, 82, 84, 86 and 88.

The method 8 begins with operation 80, in which a DC current is applied to a first word line analogous to the word line WL1.

The method 8 proceeds to operation 82, in which a first leakage current analogous to the first leakage current I20, caused by the DC current, from a test cell controllable by the second word line is measured.

The method 8 continues with operation 84, in which a pulse including an AC component and a DC component is applied to the first word line.

The method 8 proceeds to operation 86, in which a second leakage current analogous to the second leakage current I22, caused by the pulse, from the test cell is measured.

The method 8 proceeds to operation 88, in which a row hammer effect is evaluated based on the first leakage current and the second leakage current.

The method 8 is merely an example, and is not intended to limit the present disclosure beyond what is explicitly recited in the claims. Additional operations can be provided before, during, and after the method 8, and some operations described can be replaced, eliminated, or moved around for additional embodiments of the method.

Figure 13:
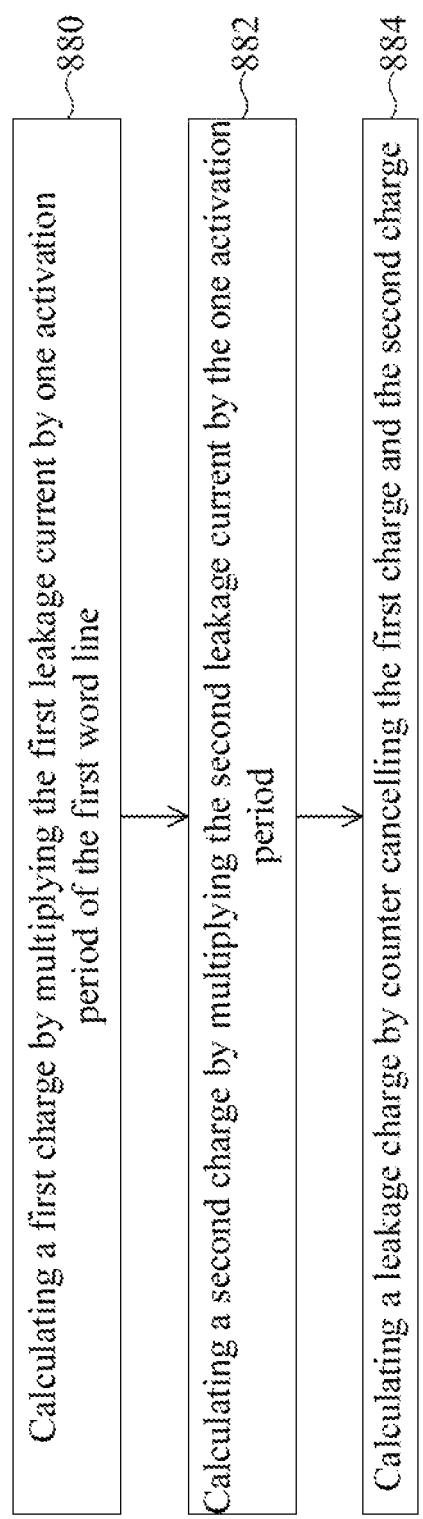
FIG. 13 is a flow chart of operation 88 shown in FIG. 12, in accordance with some embodiments of the present disclosure.

FIG. 13 is a flow chart of operation 88 shown in FIG. 12, in accordance with some embodiments of the present disclosure. Referring to FIG. 13, operation 88 includes operations 880, 882 and 884.

Operation 88 begins with operation 880, in which a first charge is calculated by multiplying the first leakage current by one activation period of the first word line.

Operation 88 proceeds to operation 882, in which a second charge is calculated by multiplying the second leakage current by the one activation period.

Operation 88 continues with operation 884, in which a leakage charge is calculated by cancelling the first charge and the second charge.

Operation 88 is merely an example, and is not intended to limit the present disclosure beyond what is explicitly recited in the claims Additional operations can be provided before, during, and after the operation 88, and some operations described can be replaced, eliminated, or moved around for additional embodiments of the method.

Figure 14:
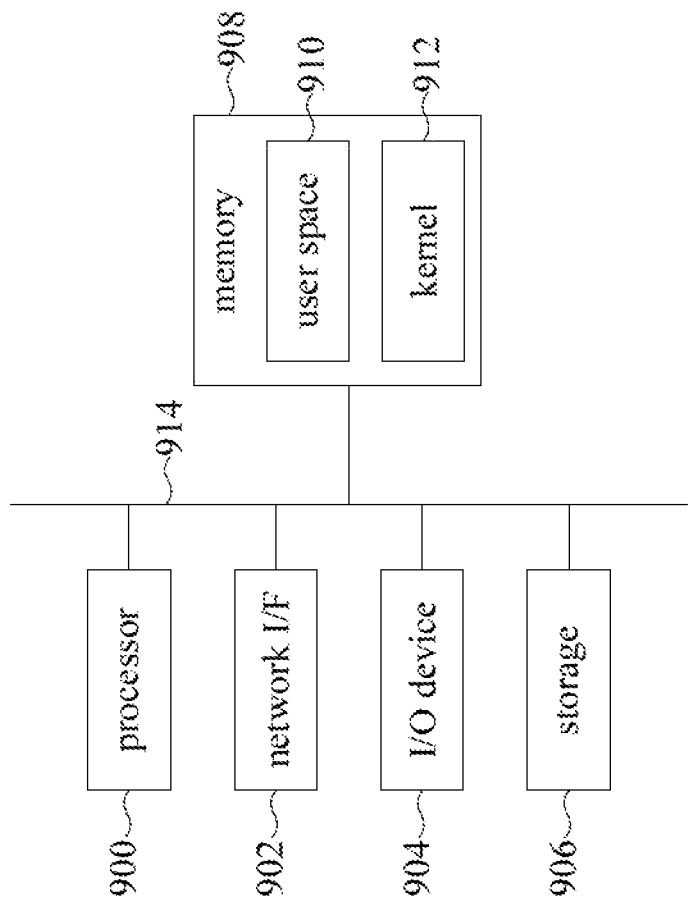
FIG. 14 is a block diagram of the work station of FIG. 1, in accordance with some embodiments of the present disclosure.

FIG. 14 is a block diagram of the work station 12 of FIG. 1, in accordance with some embodiments of the present disclosure. One or more of the tools, systems, or operations described with respect to FIGS. 6 to 7 and 11 to 13 are realized in some embodiments by one or more computer systems 9 of the work station 12 of FIG. 14. The computer systems 9 comprises a processor 900, a memory 908, a network interface (I/F) 902, a storage 906, and an input/output (I/O) device 904 communicatively coupled via a bus 914 or other interconnection communication mechanism.

The memory 908 comprises, in some embodiments, a random access memory (RAM), other dynamic storage device, read-only memory (ROM), or other static storage device, coupled to the bus 914 for storing data or instructions to be executed by the processor 900, e.g., kernel 912, user space 910, portions of the kernel or the user space, and components thereof. The memory 908 is also used, in some embodiments, for storing temporary variables or other intermediate information during execution of instructions to be executed by the processor 900.

In some embodiments, a storage device 906, such as a magnetic disk or optical disk, is coupled to the bus 914 for storing data or instructions, e.g., kernel 912, user space 910, etc. The I/O device 904 comprises an input device, an output device, or a combined input/output device for enabling user interaction with the computer system 9. An input device comprises, for example, a keyboard, keypad, mouse, trackball, trackpad, or cursor direction keys for communicating information and commands to the processor 900. An output device comprises, for example, a display, a printer, a voice synthesizer, etc. for communicating information to a user.

In some embodiments, one or more operations or functionality of the tools or systems described with respect to FIGS. 6 to 7 and 11 to 13 are realized by the processor 900, which is programmed for performing such operations and providing such functionality. One or more of the memory 908, the I/F 902, the storage 906, the I/O device 904, the hardware components, and the bus 914 are operable to receive instructions, data, design rules, netlists, layouts, models and other parameters for processing by the processor 900.

In some embodiments, one or more of the operations, functionality of the tools, and systems described with respect to FIGS. 6 to 7 and 11 to 13 are implemented by specifically configured hardware (e.g., by one or more application specific integrated circuits (ASICs) which are included) separate from or in lieu of the processor 800. Some embodiments incorporate more than one of the described operations or functionality in a single ASIC.

In some embodiments, the operations and functionality are realized as functions of a program stored in a non-transitory computer readable recording medium. Examples of a non-transitory computer readable recording medium include, but are not limited to, external/removable or internal/built-in storage or memory unit, e.g., one or more of an optical disk, such as a DVD, a magnetic disk, such as a hard disk, a semiconductor memory, such as a ROM, a RAM, a memory card, and the like.

In the present disclosure, the work station 12 is able to establish a relationship between a threshold leakage charge and at least one of the first voltage, the second voltage, the third voltage, a voltage level of a HIGH state of the AC pulse and a voltage level of a LOW state of the AC pulse. In addition, the operator is able to create a model for EDA tools based on the relationship, which facilitates a design of a DRAM.

One aspect of the present disclosure provides a test system. The test system is for testing a DRAM (dynamic random access memory). The DRAM includes an array including a first memory row and a second memory row. The first memory row includes a first word line. The second memory row includes a second word line and a test cell. The second word line is immediately adjacent to the first word line. The test cell is controllable by the second word line. The test system includes a work station. The work station is configured to evaluate a row hammer effect on the second memory row based on a leakage charge, caused by an AC component of a pulse applied to the first word line, from the test cell.

Another aspect of the present disclosure provides a method. The method comprises applying a pulse to a first word line of a memory array; and evaluating a row hammer effect on a second word line of the memory array based on a leakage charge, caused by an AC component of the pulse, from a test cell. The second word line is immediately adjacent to the first word line. The test cell is controllable by the second word line.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A test system for testing a DRAM (dynamic random access memory), the DRAM including an array, the array including a first memory row and a second memory row, the first memory row including a first word line, the second memory row including a second word line and a test cell, the second word line immediately adjacent to the first word line, the test cell controllable by the second word line, the test system comprising:
 a work station configured to evaluate a row hammer effect on the second memory row based on a leakage charge, caused by an AC component of a pulse applied to the first word line, from the test cell;
 wherein the work station is further configured to measure a leakage current caused by the AC component, and to calculate the leakage charge by multiplying the leakage current by one activation period of the first word line.

2. The test system of claim 1, further comprising:
 a power supply configured to provide the pulse having a high state and a low state,
 wherein the work station is further configured to establish a relationship between a threshold voltage level of the high state and a threshold leakage charge, caused by the AC component, from the test cell,
 wherein the row hammer effect occurs in response to the threshold voltage level and the threshold leakage charge.

3. The test system of claim 1, wherein the first memory row includes a cell including a transistor, and the test system further comprises:
 a power supply configured to provide a first voltage and a second voltage to a drain and a source, respectively, of the transistor,
 wherein the work station is configured to establish a relationship among the first voltage, the second voltage, and a threshold leakage charge, caused by the AC component, from the test cell,
 wherein the row hammer effect occurs in response to the first voltage, the second voltage and the threshold leakage charge.

4. The test system of claim 3, wherein the power supply is further configured to provide a third voltage to a body of the transistor,
 wherein the work station is configured to establish a relationship among the first voltage, the second voltage, the third voltage and the threshold leakage charge,
 wherein the row hammer effect occurs in response to the first voltage, the second voltage, the third voltage and the threshold leakage charge.

5. The test system of claim 1, wherein the first memory row includes a cell including a transistor, and the test system further comprises:
 a power supply configured to provide a second voltage to a body of the transistor,
 wherein the work station is configured to establish a relationship between the second voltage and a threshold leakage charge, caused by the AC component, from the test cell,
 wherein a row hammer effect occurs in response to the second voltage and the threshold leakage charge.

6. A test system for testing a DRAM (dynamic random access memory), the DRAM including an array, the array including a first memory row and a second memory row, the first memory row including a first word line, the second memory row including a second word line and a test cell, the second word line immediately adjacent to the first word line, the test cell controllable by the second word line, the test system comprising:
 a work station configured to evaluate a row hammer effect on the second memory row based on a leakage charge, caused by an AC component of a pulse applied to the first word line, from the test cell;
 wherein the work station is further configured to calculate the leakage charge by eliminating a first charge caused by a DC component of the pulse from a second charge caused by the pulse.

7. The test system of claim 6, wherein a DC current and the pulse are applied to the first word line in a staggered manner,
 wherein the work station is configured to measure a first leakage current, caused by the DC current, from the test cell; measure a second leakage current, caused by the pulse, from the test cell; and evaluate the row hammer effect based on the first leakage current and the second leakage current.

8. The test system of claim 7, wherein the work station is further configured to calculate the first charge by multiplying the first leakage current by one activation period of the first word line, and to calculate the second charge by multiplying the second leakage current by the one activation period.

9. The test system of claim 7, wherein the work station is further configured to calculate the leakage charge by cancelling the first charge and the second charge.

* * * * *